United States Patent
Chen

(10) Patent No.: US 7,449,789 B2
(45) Date of Patent: Nov. 11, 2008

(54) LIGHT-EMITTING DEVICE, PLANAR LIGHT SOURCE AND DIRECT TYPE BACKLIGHT MODULE

(75) Inventor: Ga-Lane Chen, Fremont, CA (US)

(73) Assignee: Hon Hai Precision Industry Co., Ltd., Tu-Cheng (TW)

( * ) Notice: Subject to any disclaimer, the term of this patent is extended or adjusted under 35 U.S.C. 154(b) by 0 days.

(21) Appl. No.: 11/397,019

(22) Filed: Apr. 3, 2006

(65) Prior Publication Data
US 2007/0085092 A1    Apr. 19, 2007

(30) Foreign Application Priority Data
Oct. 14, 2005   (TW) ............................. 94135972 A

(51) Int. Cl.
*H01L 33/00* (2006.01)

(52) U.S. Cl. ................ 257/791; 257/13; 257/88; 257/102; 257/89; 257/E51.018; 257/E33.001; 257/E25.028; 257/E33.077

(58) Field of Classification Search .......... 257/79–103, 257/13, E51.018, E33.001, E25.028, E51.022
See application file for complete search history.

(56) References Cited

U.S. PATENT DOCUMENTS

| | | | | |
|---|---|---|---|---|
| 4,319,259 A | * | 3/1982 | Ohsima et al. | 257/96 |
| 5,583,350 A | * | 12/1996 | Norman et al. | 257/88 |
| 5,583,351 A | * | 12/1996 | Brown et al. | 257/89 |
| 6,100,103 A | * | 8/2000 | Shim et al. | 438/26 |
| 6,600,175 B1 | * | 7/2003 | Baretz et al. | 257/100 |
| 2003/0020078 A1 | * | 1/2003 | Klosowiak et al. | 257/83 |

* cited by examiner

*Primary Examiner*—Wai-Sing Louie
*Assistant Examiner*—Marc Armand
(74) *Attorney, Agent, or Firm*—Andrew C. Cheng; Wel-Te Chung

(57) ABSTRACT

A light-emitting device (12) includes a base (14) and two red light-emitting chips (22), two green light-emitting chips (24) and a blue light-emitting chip (26) arranged on the base red, green, blue, green, red in a left-to-right order. The red light-emitting chips, the green light-emitting chips and the blue light-emitting chip include a plurality of red-color quantum dots, green-color quantum dots and blue-color quantum dots respectively. A planar light source (10) includes a planar plate (102), and a plurality of the light-emitting devices arranged in an array on the planar plate. A direct type backlight module (20) includes a diffusing sheet (18) and the planar light source facing a surface of the diffusing sheet.

3 Claims, 3 Drawing Sheets

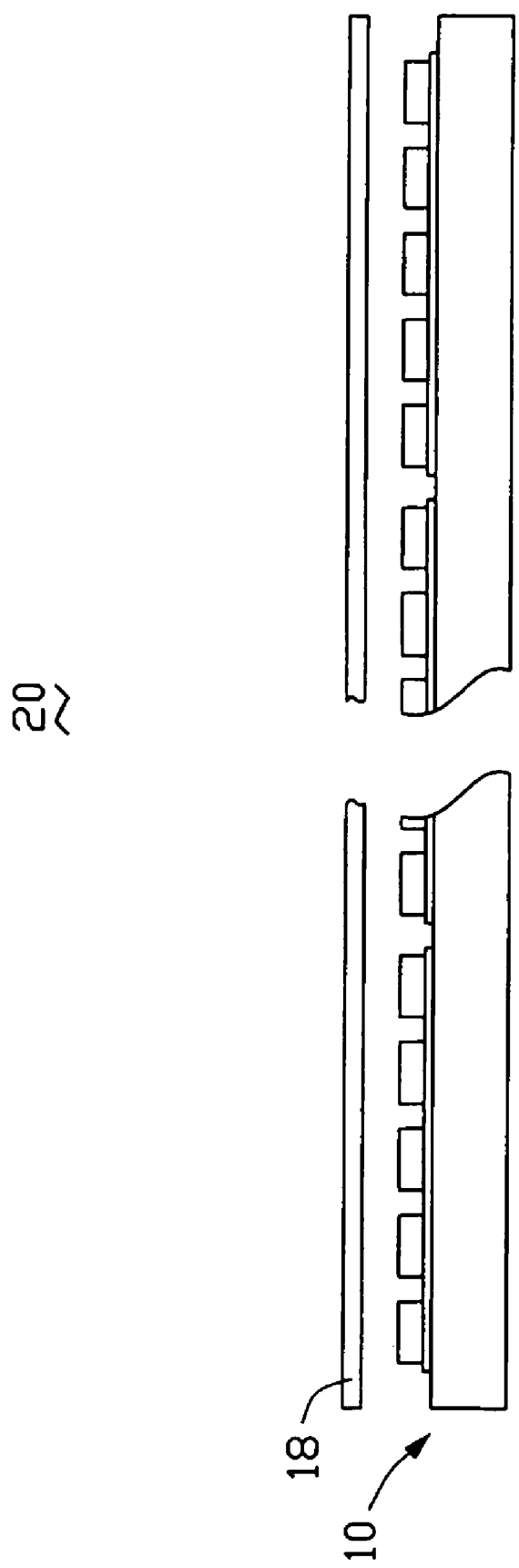

LIGHT-EMITTING DEVICE, PLANAR LIGHT SOURCE AND DIRECT TYPE BACKLIGHT MODULE

BACKGROUND

1. Technical Field

The invention generally relates to a light-emitting device, a planar light source and a direct type backlight module.

2. Discussion of Related Art

Nowadays, liquid crystal materials are widely utilized in various liquid crystal displays (LCDs) having different sizes for different applications, such as TVs, liquid crystal projectors, mobile telephones, personal digital assistants (PDAs), etc. Since liquid crystal itself cannot emit light, light sources must be utilized to irradiate/illuminate liquid crystal for image display. The light sources are called backlight sources because they are usually configured behind liquid crystal panels. A combination of all components behind the liquid crystal panels, including the light sources, is generally referred to as a backlight module. Usually, backlight modules can be classified into edge type backlight modules and direct type backlight modules.

Edge type backlight modules are usually utilized in middle sized or small sized LCDs, such as LCDs used in mobile telephones. Direct type backlight modules are usually utilized in large sized LCDs, such as LCDs used in TVs. In direct type backlight modules, a plurality of cold cathode fluorescent lamps (CCFLs) are generally used as light sources. The plurality of CCFLs are linear and arranged parallel to each other. Due to the spacing between the LCDs, the resulting light source is discontinuous. The CCFLs may also have differences in brightness and chroma between each other such that the illumination of the direct type backlight module is poor. As well as this, the CCFLs contain mercury, making them difficult and dangerous to dispose of safely.

What is needed, therefore, is a light-emitting device, a planar light source and a direct type backlight module with uniform brightness and chroma.

SUMMARY

A light-emitting device according to one preferred embodiment includes a base, two red light-emitting chips, two green light-emitting chips and a blue light-emitting chip. The red light-emitting chips, the green light-emitting chips and the blue light-emitting chip include a plurality of red-color quantum dots, green-color quantum dots and blue green-color quantum dots respectively. The red light-emitting chips, the green light-emitting chips, the blue light-emitting chips are arranged on the base in red-green-blue-green-red formation.

A planar light source according to another preferred embodiment includes a planar plate, and a plurality of the light-emitting devices arranged on the planar plate in an array.

A direct type backlight module according to another preferred embodiment includes a diffusing sheet and the planar light source opposite a surface of the diffusing sheet.

Compared with conventional CCFLs, this light-emitting device has following advantages. Quantum dot energy level in the light-emitting device can have different quantum levels. The bandwidth can be controlled in a more narrow way so that it is easier to distinguish between the individual light beams emitted from each quantum dot. Furthermore, light-emitting device having quantum dots are more environmentally friendly.

Advantages and novel features will become more apparent from the following detailed description of the present light-emitting device, planar light source and direct type backlight module, when taken in conjunction with the accompanying drawings.

BRIEF DESCRIPTION OF THE DRAWINGS

Many aspects of the present light-emitting device, its related planar light source and direct type backlight module can be better understood with reference to the following drawings. The components in the drawings are not necessarily drawn to scale, the emphasis instead being placed upon clearly illustrating the principles of the present light-emitting device, its related planar light source and direct type backlight module. Moreover, in the drawings, like reference numerals designate corresponding parts throughout the several views.

FIG. 4 is a schematic, side view of a direct type backlight module in accordance with a third embodiment.

DETAILED DESCRIPTION OF PREFERRED EMBODIMENTS

References will now be made to the drawings to describe preferred embodiments of the present light-emitting device, its related planar light source and direct type backlight module, in detail.

Figure 1:
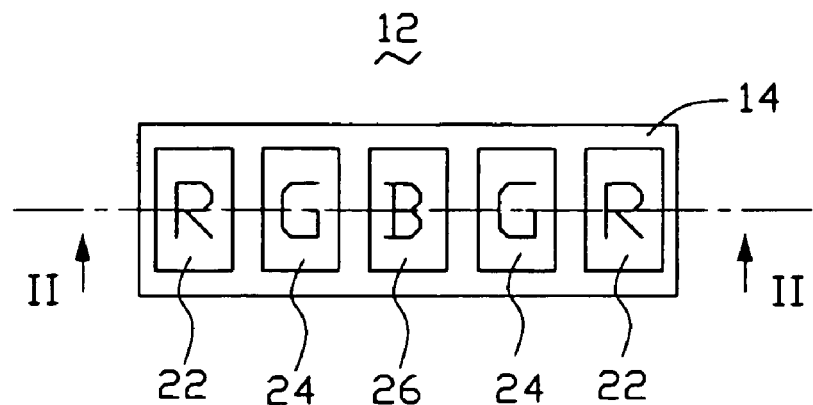
FIG. 1 is a schematic, top view of a light-emitting device in accordance with a first preferred embodiment.
Figure 2:
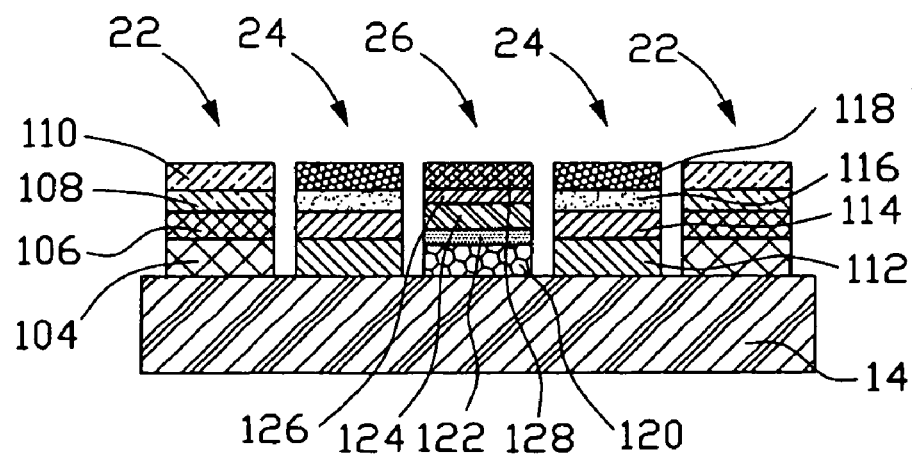
FIG. 2 is a schematic, cross-sectional view taken along line II-II of FIG. 1.

Referring to FIGS. 1 and 2, a light-emitting device 12 in accordance with a first embodiment is shown. The light-emitting device 12 includes a base 14, two red light-emitting chips 22, two green light-emitting chips 24 and a blue light-emitting chip 26.

The red light-emitting chips 22, the green light-emitting chips 24 and the blue light-emitting chip 26 are arranged on the base 14 in red-green-blue-green-red pattern from left to right. The red light-emitting chips 22, the green light-emitting chips 24 and the blue light-emitting chip 26 include a plurality of red-color quantum dots, green-color quantum dots and blue-color quantum dots respectively. The base 14 is made from glass plate or quartz glass plate.

The red light-emitting chip 22 includes a first semiconductor layer 104, a p-type gallium arsenide layer 106 formed on the first semiconductor layer 104, a gallium arsenide phosphide layer 108 formed on the p-type gallium arsenide layer 106 and an n-type gallium arsenide layer 110 formed on the gallium arsenide phosphide layer 108. The plurality of red-color quantum dots are formed in the gallium arsenide phosphide layer 108. The first semiconductor layer 104 serves as a supporting layer for the red light-emitting chip 22. The first semiconductor layer 104 is made of a material which may be selected from a group consisting of gallium phosphide, gallium arsenide and gallium aluminum arsenide.

The green light-emitting chip 24 includes a second semiconductor layer 112, a p-type aluminum gallium indium phosphide layer 114 formed on the second semiconductor layer 112, an undoped aluminum gallium indium phosphide layer 116 formed on the p-type aluminum gallium indium phosphide layer 114 and an n-type aluminum gallium indium phosphide layer 118 formed on the undoped aluminum gallium indium phosphide layer 116. The plurality of green-color quantum dots are formed in the undoped aluminum gallium indium phosphide layer 116. The second semiconductor layer 112 serves as a supporting layer for the green light-emitting chip 24. The second semiconductor layer 112 is made of a material which may be selected from a group consisting of gallium phosphide and gallium arsenide.

The blue light-emitting chip 26 includes a third semiconductor layer 120, a gallium nitride nucleation layer 122 formed on the third semiconductor layer 120, a p-type gallium nitride layer 124 formed on the gallium nitride nucleation layer 122, an indium gallium nitride layer 126 formed on the p-type gallium nitride layer 124 and an n-type gallium nitride layer 128 formed on the indium gallium nitride layer 126. The plurality of blue-color quantum dots are formed in the indium gallium nitride layer 126. The third semiconductor layer 120 serves as a supporting layer for the blue light-emitting chip 26. The third semiconductor layer 120 is made of a material which may be made from a material selected from a group consisting of aluminum oxide, silicon carbide, zinc selenide and zinc sulfide.

The quantum dots may be manufactured by a bottom up process or a top down process. In the case of the bottom up process, they are formed in a high vacuum thin film growth chamber with chip substrate materials like gallium arsenide, indium phosphide, zinc sulfide, cadmium selenide, gallium nitride, gallium or aluminum oxide etc. There are four gas lines with mass flow rate controllers and valves. A CVD (chemical vapor deposition) process can be used, such as MOCVD (metal organic chemical vapor deposition), thermal CVD or PECVD (plasma enhanced chemical vapor deposition) etc, or the MBE (molecule beam epitaxy) process. For MOCVD, the gas can be Ammonia, Trimethylinduum, Trimethylgallium, or Silicon Hydride. The CVD temperature can be as high as 1200° C. The quantum dots growing directly from the bottom up.

In the case of the top down process for manufacturing quantum dots, firstly a quantum well structure is provided on a chip substrate. Secondly a photoresistant layer is spin-coated onto the quantum well. Thirdly, the photoresistant layer is exposed and developed to create the quantum dot patterning. Finally the photoresistant layer is etched by wet etching or dry etching to form dot shaped quantum dots. The chip substrate materials such as gallium arsenide, indium phosphide, gallium nitride, zinc sulfide, or cadmium selenide etc. III-V or IV-VI materials in periodical table can be used to form the quantum dots.

Quantum energy level of quantum dot can have different quantum levels. The bandwidth of quantum dot can thus be controlled more narrowly so that the individual light beams emitted from each quantum dot are easier to distinguish from each other, compared to conventional light-emitting chips and CCFL. Furthermore, this structure is more environmentally friendly than conventional designs as it is constructed of less harmful material.

Figure 3:
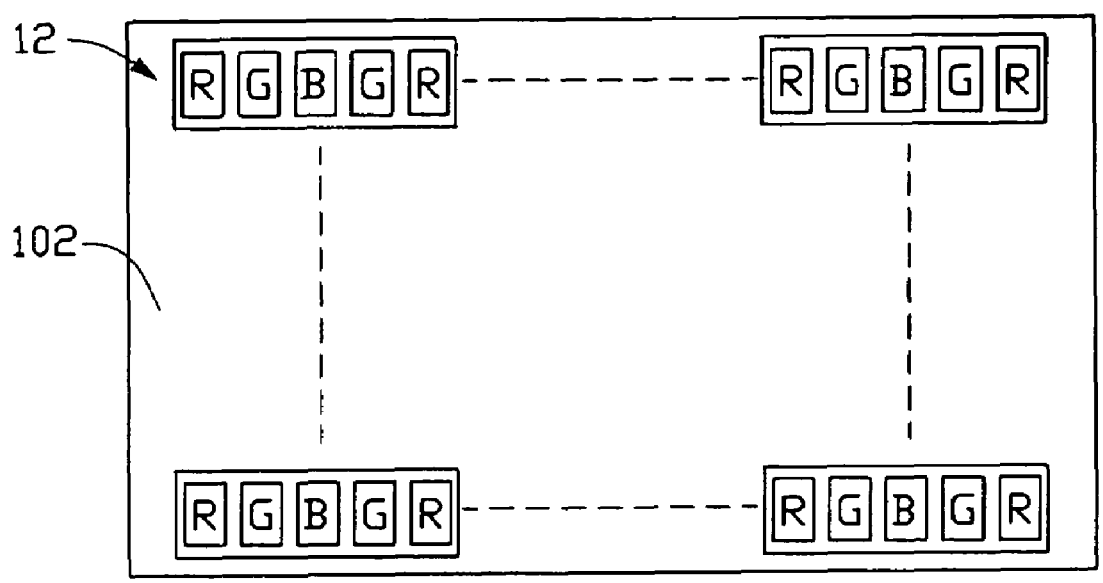
FIG. 3 is a schematic, top view of a planar light source in accordance with a second embodiment.

Referring to FIG. 3, a planar light source 10 in accordance with a second embodiment is shown. The planar light source 10 mainly includes a planar plate 102 and a plurality of light-emitting devices 12 provided by the first embodiment.

The light-emitting devices 12 are arranged on the planar plate in an array to form the planar light source 10.

Referring to FIG. 4, a direct type backlight module 20 in accordance with a third embodiment is shown. The direct type backlight module 20 includes a diffusing sheet 18 and a planar light source 10 provided by the second embodiment.

The planar light source 10 is arranged facing a surface of the diffusing sheet 18. Due to the easily distinguishable light emitted from the light-emitting chips, the direct type backlight module 20 emits light with uniform brightness and chroma, creating good illumination for the LCD. The red light, green light and blue light emitted from the planar light source 10 are fully mixed in the diffusing sheet 18 and emerge as white light from the diffusing sheet 18. White light and light of other colors different from the three primary colors can be obtained by mixing the three primary colors in the diffusing sheet 18. With quantum dot light-emitting devices, color presentation on LCDs may exceed current NTSC (National Television Systems Committee) specification by 20%.

Furthermore, as is known to those skilled in the art, the direct type backlight module 20 may further optionally include one or more optical elements (not shown), such as a polarizer and/or a brightness-enhancing plate stacked over the diffusing sheet 18.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A light-emitting device comprising:
   a base;
   two red light-emitting chips each comprising a first semiconductor layer formed on the base, a p-type gallium arsenide layer formed on the first semiconductor layer, gallium arsenide phosphide layer formed on the p-type gallium arsenide layer, an n-type gallium arsenide layer formed on the gallium arsenide phosphide layer, and a plurality of red-color quantum dots being formed in the gallium arsenide phosphide layer;
   two green light-emitting chips each comprising a second semiconductor layer formed on the base, a p-type aluminum gallium indium phosphide layer formed on the second semiconductor layer, an undoped aluminum gallium indium phosphide layer formed on the p-type aluminum gallium indium phosphide layer, an n-type aluminum gallium indium phosphide layer formed on the undoped aluminum gallium indium phosphide layer, and a plurality of green-color quantum dots being formed in the undoped aluminum gallium indium phosphide layer;
   a blue light-emitting chip comprising a third semiconductor layer formed on the base, a gallium nitride nucleation layer formed on the third semiconductor layer, a p-type gallium nitride layer formed on the gallium nitride nucleation layer, an indium gallium nitride layer formed on the p-type gallium nitride layer, an n-type gallium nitride layer formed on the indium gallium nitride layer, and a plurality of blue-color quantum dots being formed in the indium gallium nitride layer;
   wherein the red light-emitting chips, the green light-emitting chips, the blue light-emitting chip are arranged on the base red, green, blue, green, red in a left-to-right order.

2. A planar light source comprising:
   a planar plate;
   a plurality of light-emitting devices arranged on the planar plate in an array, each light-emitting device comprising a base;
   two red light-emitting chips each comprising a first semiconductor layer formed on the base, a n-type gallium arsenide layer formed on the first semiconductor layer, a gallium arsenide phosphide layer formed on the p-type gallium arsenide layer, an n-type gallium arsenide layer formed on the gallium arsenide phosphide layer, and a plurality of red-color quantum dots being formed in the gallium arsenide phosphide layer;
   two green light-emitting chips each comprising a second semiconductor layer formed on the base, a n-type aluminum gallium indium phosphide layer formed on the second semiconductor layer, an undoped aluminum gallium indium phosphide layer formed on the p-type aluminum gallium indium phosphide layer, an n-type aluminum gallium indium phosphide layer formed on the undoped aluminum gallium indium phosphide layer, and a plurality of green-color quantum dots being formed in the undoped aluminum gallium indium phosphide layer;

a blue light-emitting chip comprising a third semiconductor layer formed on the base, a gallium nitride nucleation layer formed on the third semiconductor layer, a n-type gallium nitride layer formed on the gallium nitride nucleation layer, an indium gallium nitride layer formed on the p-type gallium nitride layer, an n-type gallium nitride layer formed on the indium gallium nitride layer, and a plurality of blue-color quantum dots being formed in the indium gallium nitride layer;

wherein the red light-emitting chips, the green light-emitting chips, the blue light-emitting chip are arranged on the base red, green, blue, green, red in a left-to-right order.

3. A direct type backlight module comprising:

a diffusing sheet;

a planar light source arranged facing a surface of the diffusing sheet, the planar light source comprising a planar plate; and a plurality of light-emitting devices arranged on the planar plate in an array, each light-emitting device comprising a base;

two red light-emitting chips each comprising a first semiconductor layer formed on the base, a p-type gallium arsenide layer formed on the first semiconductor layer, a gallium arsenide phosphide layer formed on the p-type gallium arsenide layer, an n-type gallium arsenide layer formed on the gallium arsenide phosphide layer, and a plurality of red-color quantum dots being formed in the gallium arsenide phosphide layer;

two green light-emitting chips each comprising a second semiconductor layer formed on the base, a p-type aluminum gallium indium phosphide layer formed on the second semiconductor layer, an undoped aluminum gallium indium phosphide layer formed on the p-type aluminum gallium indium phosphide layer, an n-type aluminum gallium indium phosphide layer formed on the undoped aluminum gallium indium phosphide layer, and a plurality of green-color quantum dots being formed in the undoped aluminum gallium indium phosphide layer;

a blue light-emitting chip comprising a third semiconductor layer formed on the base, a gallium nitride nucleation layer formed on the third semiconductor layer, a p-type gallium nitride layer formed on the gallium nitride nucleation layer, an indium gallium nitride layer formed on the p-type gallium nitride layer, an n-type gallium nitride layer formed on the iridium gallium nitride layer, and a plurality of blue-color quantum dots being formed in the indium gallium nitride layer;

wherein the red light-emitting chips, the green light-emitting chips, the blue light-emitting chip are arranged on the base red, green, blue, green, red in a left-to-right order.

* * * * *